United States Patent [19]

Halder

[11] 4,234,872
[45] Nov. 18, 1980

[54] CIRCUIT ARRANGEMENT FOR A KEYBOARD

[75] Inventor: Mathis Halder, Baar, Switzerland

[73] Assignee: LGZ Landis & Gyr Zug AG, Zug, Switzerland

[21] Appl. No.: 15,605

[22] Filed: Feb. 23, 1979

[30] Foreign Application Priority Data

Mar. 8, 1978 [CH] Switzerland ............... 2516/78

[51] Int. Cl.³ .............................................. G06F 3/02
[52] U.S. Cl. .......................... 340/365 R; 340/166 R
[58] Field of Search ............ 340/365 R, 365 C, 365 E, 340/365 S, 166 R, 711, 712

[56] References Cited

U.S. PATENT DOCUMENTS

| | | | |
|---|---|---|---|
| 3,732,389 | 5/1973 | Kaelin et al. | 340/365 C |
| 3,811,025 | 5/1974 | Bach | 340/365 C |
| 3,990,070 | 11/1976 | Spence | 340/365 R |
| 4,065,754 | 12/1977 | Miura et al. | 340/166 R |
| 4,077,036 | 2/1978 | Avakian et al. | 340/365 S |
| 4,092,640 | 5/1978 | Satoh | 340/365 R |

OTHER PUBLICATIONS

"Scanned Optical Keyboard", J. E. Fox, IBM Tech. Dis. Bull'n., vol. 20, No. 9, Feb. 1978, pp. 3615–3616.

*Primary Examiner*—Thomas A. Robinson

[57] ABSTRACT

A circuit arrangement for a keyboard is disclosed, in which the switches of the keyboard are each connected in series with a respective LED to form a switch matrix, the rows of which are connected to a multiplexer and the colums of which are connected to an evaluation device. The LED's serve as decoupling diodes, and furthermore form a diode matrix of an optical indication field by which the commands entered into the keyboard through activation of its switches, or other information, can be made optically visible. Upon activation of a transistor switch, a resistor is switched parallel to a measurement resistor, whereby an LED is lighted at the point of intersection of the activated matrix row and matrix column.

4 Claims, 1 Drawing Figure

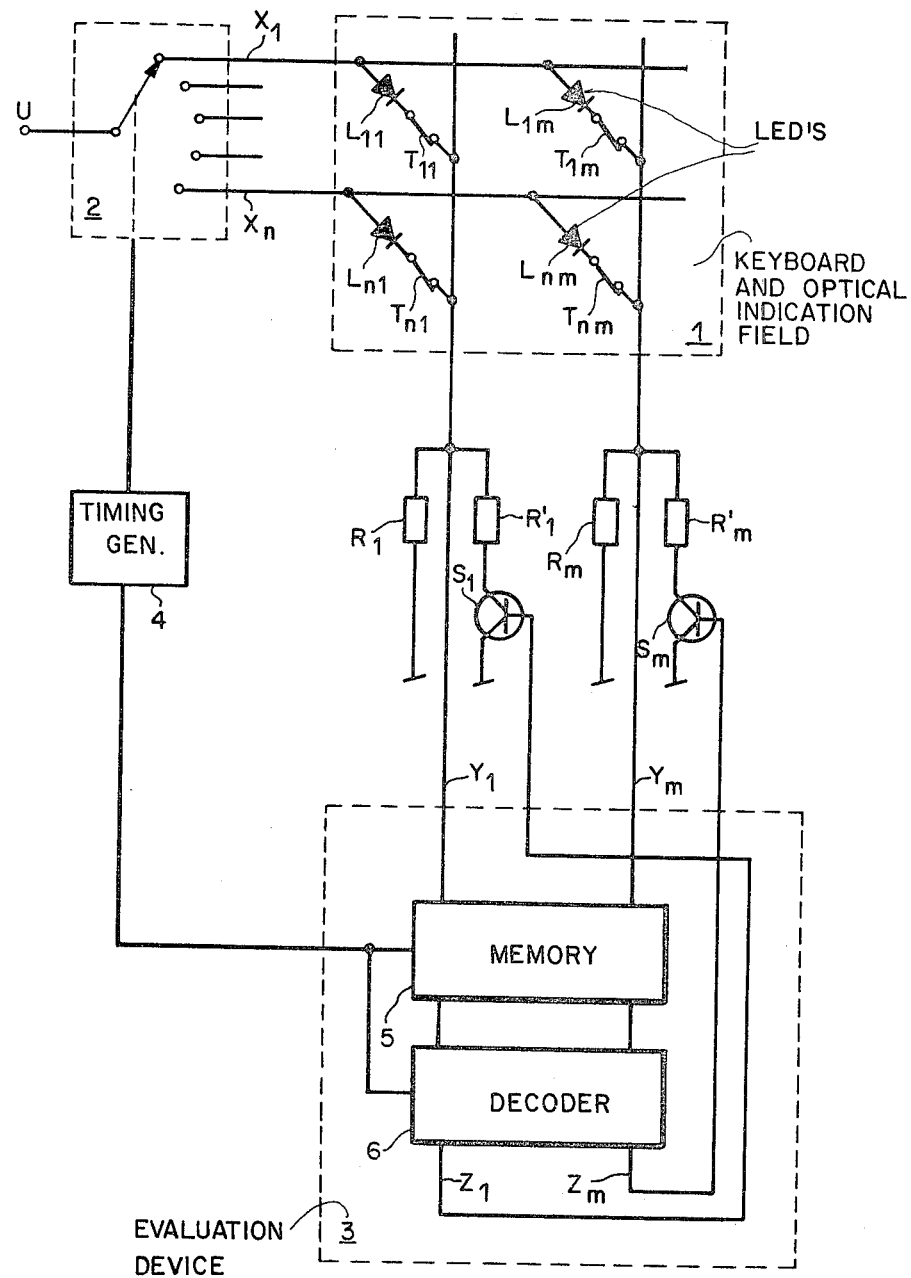

CIRCUIT ARRANGEMENT FOR A KEYBOARD

BACKGROUND AND BRIEF DESCRIPTION OF THE INVENTION

This invention relates to an improved circuit arrangement for a keyboard of the type in which the switches are connected in series with diodes, forming a switch matrix, the matrix rows being connected to a multiplexer and the matrix columns being connected to an evaluation device.

Circuit arrangements of this type are known (U.S. Pat. No. 4,033,221 entitled, "Key Switch System", Hamamatsu et al) in which the individual matrix rows are called up one after the other by the multiplexer and communicate the switch states of the switches to a memory. The diodes which are connected in series with the switches prevent reciprocal influence of the matrix columns. It is also known (German Auslegeschrift No. 27 08 212 published Nov. 24, 1977) how to switch LED's into a matrix form for purposes of indication of positions, and how to activate one row and one column of the diode matrix by a decoder, so that the LED's light up at the point of intersection of the relevant row and column. Finally, a circuit with operating keys for switching on device operations is known (U.S. Pat. No. 4,083,012 entitled "Automatic Function Setting and Communication Arrangement For a Communications Receiver", W. Kamow), in which each operating key is associated with an LED, which lights up after activation of the operating key.

The invention is directed to creating a circuit arrangement of the type initially mentioned, in which the commands entered into the keyboard, or other information, are optically indicated without noteworthy increased expense. A preferred embodiment of the invention is explained below in more detail with the aid of a diagram.

DETAILED DESCRIPTION OF THE INVENTION

In the sole diagram, numeral 1 indicates a keyboard, which also represents an optical indication field, and which has switches T as well as LED's L. Keyboard 1 is connected with multiplexer 2 and evaluation device 3. The multiplexer 2 has n output leads $X_l$ to $X_n$ and the evaluation device 3 has m input leads $Y_l$ to $Y_m$, of which, for purposes of simplicity, only the first and last are represented in the diagram. The output leads $X_l$ to $X_n$ and the input leads $Y_l$ to $Y_m$ are arranged in matrix form. Each point of intersection of an output lead X and an input lead Y is bridged over with the series connection of a switch T and an LED L. For purposes of designation of the switches T and the LED's L, the reference symbols T and L are provided with two indices in the diagram, of which the first index designates the matrix row formed by an output lead X and the second index designates the matrix column formed by an input lead Y.

The switches T of keyboard 1 form, in a known manner, a switch matrix, but are different from known arrangements in that they are break contact switches (e.g., push-button switches with break contacts). The LED's serve, on the one hand, as decoupling diodes; i.e., they prevent reciprocal influencing of the matrix columns. On the other hand, the LED's form a diode matrix of an optical indication field, by which the commands entered into keyboard 1 through short activation of switches T, or other information, can be made optically visible.

Multiplexer 2 is represented in the diagram as a multiple switch, which is controlled by a timing generator 4 and which connects the positive pole of a voltage source U to the output leads $X_l$ to $X_n$ one after the other. Each of the input leads $Y_l$ to $Y_m$ of evaluation device 3 is connected with one terminal of a measurement resistor $R_l$ to $R_m$, respectively. The other terminal is switched to a ground connection or to the negative pole of the voltage source U.

In the embodiment shown, evaluation device 3 consists of a memory 5 and a decoder 6, which are controlled by timing generator 4. Input leads $Y_l$ to $Y_m$ lead to memory 5. Decoder 6 has output leads $Z_l$ to $Z_m$ each of which activates a transistor switch $S_l$ to $S_m$, respectively. Each of these transistor switches S form, together with a corresponding resistor $R'_l$ to $R'_m$, a series connection, which is connected in parallel with measurement resistor $R_l$ to $R_m$ of the corresponding matrix column.

The measurement resistors R are dimensioned in such a manner that when current flows from voltage source U through an output lead X, an LED L, a switch T and a measurement resistor R, the relevant LED is not lit up as long as transistor switch S of the relevant matrix column is blocked. Resistors R', on the other hand, have relatively low impedance in comparison with measurement resistors R, so that when a transistor switch S conducts, the current increases in the LED L connected to the point of intersection of the relevant matrix column and the matrix row activated by multiplexer 2, to the activating current level necessary for highly-visible illumination.

The circuit arrangement described operates as follows:

At first, transistor switches $S_l$ to $S_m$ are blocked. Multiplexer 2 calls up, in rapid succession, one after the other, the individual matrix rows of keyboard 1. Switches T are thus interrogated and the switch states are communicated to evaluation device 3 and recorded in its memory 5. If, for example, the first matrix row is interrogated whilst switch $T_{ll}$ is opened by a person operating keyboard 1, switch $T_{lm}$ being closed on the other hand, a current which is too low to light up LED $L_{lm}$ flows from voltage source U through output lead $X_l$ of the multiplexer 2, LED $L_{lm}$, switch $T_{lm}$ and measurement resistor $R_m$, causing a voltage drop at measurement resistor $R_m$. Thus positive voltage is present at input lead $Y_m$ of evaluation device 3, and a negative impulse arises at input lead $Y_l$, which effects that the information "Switch $T_{ll}$ opened" is recorded in coded form in memory 5. In a similar manner, switches T of other matrix columns are interrogated. The call up of the individual matrix rows is continually repeated in order to give the person operating keyboard 1 the opportunity to activate the various switches T one after the other.

Decoder 6 decodes the information stored in memory 5. When decoder 6 determines that switch $T_{ll}$ has been activated, it gives a control signal to transistor switch $S_l$ at the time at which multiplexer 2 connects voltage source U through to lead $X_l$, whereby transistor switch S is put into a conductive state, causing resistor $R'_l$ to be switched parallel to measurement resistor $R_l$, and LED $L_{ll}$ lights up as soon as switch $T_{ll}$ is no longer depressed.

Thus, the commands entered into keyboard 1 are indicated optically by the LED's L. The indications are not directly effected through activation of a switch T, but rather this occurs as an answer-back signal of one of the commands received from evaluation device 3. Thus it is guaranteed that errors in the circuit arrangement are immediately recognizable.

LED's L, as already mentioned, serve two purposes. On the one hand, they serve as decoupling diodes for the switch matrix and, on the other hand, they form an independent LED matrix of an indication field. Thus it is possible to equip a keyboard, without additional connections, with an optical indicator. Where n=m, a total of only 2 n connections is required, and the number of switches or LED's is $n^2$.

Naturally, it is possible to make other information visible through the indication field formed by LED's L than just the answer-back signals from the commands entered into keyboard 1. In order to activate a certain LED L of the diode matrix, it is only necessary to connect transistor switch S of the appropriate matrix column with a control signal then in the conductive state, when multiplexer 2 calls up the appropriate matrix row.

Drivers designed in integrated TTL-circuit technology with open commutator outputs are especially suitable for transistor switches S. An LED L of the diode matrix can naturally be activated in another manner than through the parallel switching of a resistor R' to the measurement resistor R, as, for example, through a fed-in current impulse from a separate current source. Finally, the measurement resistors R can be omitted when the inputs of evaluation device 3 have input resistors of a suitable impedance.

Evaluation device 3 can be a peripheral element of a processor unit, to which further peripheral units are connected. In such case, the processor unit can have a connection from keyboard 1 to a peripheral unit as well as a connection from the appropriate peripheral unit to the indication field of the keyboard. This permits a certain state of the keyboard to be signalled to a peripheral unit, and an answer-back signal of a certain state of the peripheral unit can be sent to the indicator field.

What is claimed is:

1. A keyboard circuit arrangement comprising:
   a plurality of light-emitting diodes arranged to provide an optical indication field;
   a like plurality of switches, each of said switches connected in series with a different one of said diodes to form a matrix with rows and columns;
   a multiplexer connected for selectively energizing successive rows of said matrix;
   an evaluation device connected to the columns of said matrix, the current flow through a matrix column normally being insufficient to activate the diode in the matrix column;
   the outputs of said evaluation device being connected to said matrix columns, said evaluation device,
   being capable of detecting when a switch has been actuated, and
   being operable, subsequent to said switch actuation, to increase current flow through the matrix column corresponding to the actuated switch when the matrix row corresponding to the actuated diode is energized to thereby activate the diode associated with the actuated switch.

2. The circuit arrangement according to claim 1 wherein said switches are normally closed, momentary break, switches.

3. The circuit arrangement according to claim 1 wherein the connections between said matrix and said evaluation device each include a measurement resistance limiting the current flow so that the current flow in a matrix column is insufficient to activate diodes in the matrix and wherein a solid state switch provides a shunt path for each of said measurement resistances to increase the current flow to thereby activate the associated diode when the solid state switch is conductive.

4. The circuit arrangement according to claim 3 wherein said solid state switches are TTL type integrated circuits.

* * * * *